US011527132B2

(12) United States Patent
Fong et al.

(10) Patent No.: US 11,527,132 B2
(45) Date of Patent: *Dec. 13, 2022

(54) MOBILE CASINO JACKPOT PAYMENT REPORTING SYSTEM WITH SECURE FORM REPORTING TO CUSTOMER

(71) Applicant: Everi Payments Inc., Austin, TX (US)

(72) Inventors: Adam Fong, Las Vegas, NV (US); Michael Elston, Portage, MI (US)

(73) Assignee: Everi Payments Inc., Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/339,471

(22) Filed: Jun. 4, 2021

(65) Prior Publication Data
US 2021/0321569 A1 Oct. 21, 2021

Related U.S. Application Data

(63) Continuation of application No. 16/584,199, filed on Sep. 26, 2019, now Pat. No. 11,030,853.

(51) Int. Cl.
*G07F 17/32* (2006.01)
*A63F 13/71* (2014.01)
*A01D 41/127* (2006.01)
*A01D 41/14* (2006.01)
*G06Q 50/02* (2012.01)

(52) U.S. Cl.
CPC ..... *G07F 17/3244* (2013.01); *A01D 41/1274* (2013.01); *A01D 41/141* (2013.01); *A01D 41/145* (2013.01); *A63F 13/71* (2014.09); *G06Q 50/02* (2013.01); *G07F 17/3218* (2013.01); *G07F 17/3225* (2013.01)

(58) Field of Classification Search
CPC .............. A01D 41/1274; A01D 41/141; A01D 41/145; G06Q 50/02; A63F 13/71; G07F 17/3244; G07F 17/3218; G07F 17/3225
See application file for complete search history.

(56) References Cited

U.S. PATENT DOCUMENTS 5,505,461 A † 4/1996 Bell
6,709,333 B1 3/2004 Bradford et al.
6,935,951 B2 † 8/2005 Paulsen
(Continued)

OTHER PUBLICATIONS

Personal digital assistant—Wilcipedia, p. 2/10. Published Jul. 23, 2018 <https://en.wikipedia.org/w/index.php?title=Personaldigitalassistant&oldid=851540806> Accessed Sep. 8, 2020. (Year: 2018).

*Primary Examiner* — Seng H Lim
(74) *Attorney, Agent, or Firm* — Weide & Miller, Ltd.

(57) ABSTRACT

Relative to a gaming system, a jackpot or game win processing device and server are configured to receive acknowledgement from a player regarding a gaming win award, such as input to the game win processing device of a signature by the player to gaming win forms. In response, the server is configured to generate at least one gaming win reporting form, such as a W2G, to generate a security code from at least two elements of personal information regarding the player, such as obtained from a casino player tracking server, to then secure the at the least one reporting form and then email the secure form to the player.

20 Claims, 10 Drawing Sheets

(56) References Cited

U.S. PATENT DOCUMENTS

| | | |
|---|---|---|
| 8,221,224 B2 | 7/2012 | Nguyen et al. |
| 8,246,450 B2 | 8/2012 | Nguyen et al. |
| 8,517,823 B2 | 8/2013 | Nguyen et al. |
| 8,727,892 B1 | 5/2014 | Chun |
| 8,753,194 B2 † | 6/2014 | Schneider |
| 9,715,787 B1 | 7/2017 | Sanford et al. |
| 10,297,105 B2 | 5/2019 | LeMay et al. |
| 10,319,184 B2 † | 6/2019 | Flaherty |
| 11,030,854 B2 * | 6/2021 | Alderucci ........... G07F 17/3244 |
| 2003/0083126 A1 | 5/2003 | Paulsen |
| 2005/0181864 A1 | 8/2005 | Britt et al. |
| 2007/0099696 A1 | 5/2007 | Nguyen et al. |
| 2008/0207296 A1 | 8/2008 | Lutnick et al. |
| 2009/0292641 A1 * | 11/2009 | Weiss ....................... G07C 9/27 705/72 |
| 2012/0046097 A1 | 2/2012 | Nguyen et al. |
| 2012/0122555 A1 * | 5/2012 | Schneider ............. G06Q 40/123 463/25 |
| 2013/0275169 A1 * | 10/2013 | Acres .................. G07F 17/3241 705/7.14 |
| 2014/0244456 A1 * | 8/2014 | Huang ................. G06Q 40/123 705/31 |
| 2017/0053489 A1 | 2/2017 | Colvin et al. |
| 2018/0082516 A1 | 3/2018 | Kubajak et al. |

\* cited by examiner
† cited by third party

FIG. 3

FIG. 9

MOBILE CASINO JACKPOT PAYMENT REPORTING SYSTEM WITH SECURE FORM REPORTING TO CUSTOMER

RELATED APPLICATION DATA

The present application is a continuation of U.S. application Ser. No. 16/584,199, filed Sep. 26, 2019, which claims priority to U.S. Provisional Application Ser. No. 62/739,841, filed Oct. 1, 2018. Each prior application is incorporated herein by reference in its entirety.

FIELD OF THE INVENTION

The present invention relates to casino gaming systems and methods of paying jackpots and preparing associated jackpot reports.

BACKGROUND OF THE INVENTION

Casino winnings may be paid in different manners. For example, relative to a gaming machine which is capable of dispensing monetary winnings or a monetary value ticket or the like, the winnings may be directly awarded and then dispensed to the player. As one example, a player might win $500. Those winnings might be associated with the monetary value credit meter at the gaming machine. The player might then elect to cash-out that balance, including the winnings, as either coins dispensed at the machine or, in most modern gaming machines, a monetary value ticket which can be redeemed.

A casino may desire, however, to validate larger jackpot. In that event, the gaming machine may report a jackpot win to the casino gaming system. However, the jackpot winnings may not be awarded until casino personnel validate the win.

In addition, some jurisdictions like the U.S. require that a casino report player winnings over certain thresholds. For example, relative to a gaming machine, this threshold is currently $1200 in the U.S. In a situation where a player wins more than $1200.00, the casino will generally require the player to complete a jackpot winnings form which the casino can then use to report the jackpot win to the Internal Revenue Service of the U.S. government. This form, called a W2G in the U.S., includes information regarding the amount of the win and the player's identity (such as their name and social security number and the like).

One problem for casinos is that the player must later submit a copy of the tax reporting form with their tax return. Thus, a casino must generally provide a copy of the tax reporting form to the player, such as in the form of a receipt. However, players often lose their copy of the form. At tax filing time (usually April 15 of each year in the U.S.), players often bombard casinos with requests for copies of their tax reporting forms. In addition, these forms often include sensitive personal information, such that exposure of the information associated with the form can be damaging.

A new method of providing players with jackpot win forms, such as official game win tax reporting forms, is desired.

SUMMARY OF THE INVENTION

Embodiments of the invention comprise methods and systems for generating and securing gaming win reporting forms for access by a player. In one embodiment, the method and system generates and secures W2G gaming win IRS reporting forms for access by a player.

In one embodiment, in the event of a game win that requires reporting of the award, a player's acknowledgement is preferably received at a mobile jackpot reporting device. The device may be operated by an attendant and be configured to receive the signature of the player.

The acknowledgement is transmitted from the reporting device to a jackpot or gaming win processing server. The server may be configured to generate one or more reporting forms. Preferably, the server generates a security code from at least two elements of personal information regarding the player. The personal information may be collected from the player, such as via the reporting device, or from a remote source, such as the player's player tracking account stored at a remote casino server. Alternatively, the security code might be obtained from the player via input to the reporting device.

The server preferably utilizes the security code to secure the one or more reporting forms. For example, the security code may be utilized as a password relative to password protection of the forms, or be used in encrypting the forms. Upon receipt of the security code, the player may access the forms.

Further objects, features, and advantages of the present invention over the prior art will become apparent from the detailed description of the drawings which follows, when considered with the attached figures.

DESCRIPTION OF THE DRAWINGS

FIGS. 3-9 illustrate screen displays in accordance with embodiments of the invention.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Embodiments of the invention comprise methods and systems for generating jackpot reports for winning casino game wagers and for securely controlling access to the forms by the player.

Figure 1:
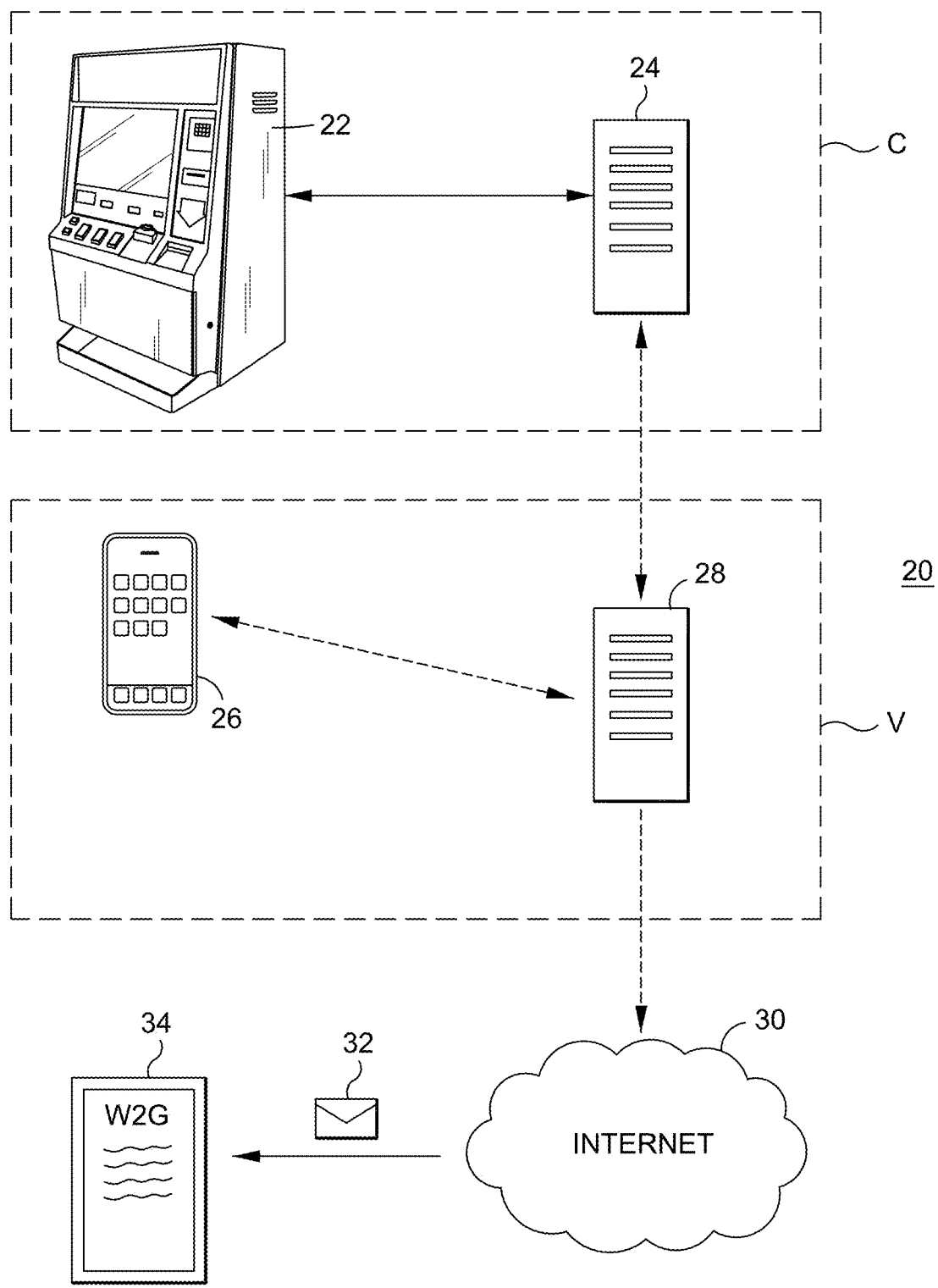
FIG. 1 illustrates one embodiment of a system of the present invention.

One embodiment of a system 20 of the invention is illustrated in FIG. 1. The system 20 includes a casino gaming system C. This system C may include a plurality of gaming devices, such as one or more gaming machines 22 which are described below in more detail. The casino gaming system C may include other types of gaming devices such as gaming tables and the like, at which one or more games, and preferably wager-based games which offer a play the opportunity for winnings, are presented.

The casino gaming system C may include a wide variety of other features or elements. For example, the casino gaming system C may include one or more casino servers 24. The casino server 24 may comprise one or more processors or controllers, at least one communication device or interface, a database or other data storage device, and one or more additional memory or data storage devices (such as separate from the database). In one or more embodiments, the processor(s) is configured to execute one or more instructions, such as in the form of machine readable code (i.e. "software"), to allow the server 24 to perform various functionality, such as the functionality described herein. The software is preferably non-transitory, such as by being fixed in a tangible medium. For example, the software may be stored in the one or more memory devices. One or more of the memory devices may be read-only. In addition, the software may be stored on a removable medium in some embodiments. In general, the one or more memory devices are used as temporary storage. For example, the one or more memory devices may be random access memory or cache memory used to temporarily store some user information and/or instructions for execution by the at least one processor.

The software may comprise one or more modules or blocks of machine readable code. Each module may be configured to implement particular functionality when executed by the one or more processors, and the various modules may work together to provide overall integrated functionality. Of course, in certain embodiments, it is also possible for various of the functionality to be implemented as hardware, i.e. a processor or chip which is particularly designed to implement various of the functionality described herein.

In one embodiment, the casino server 24 may include (or be linked communicatively at one or more times to) one or more input and/or output devices, such as a keyboard, mouse, touchscreen, video display or the like, whereby the processor may receive information from an operator or servicer of the server 24 and/or output information thereto. This allows, for example, an operator of the server 24 to interface with the server 24 to upgrade, maintain, monitor, etc., it. In other embodiments, an operator might interface with the server 24 via a separate workstation or other device.

In one embodiment, the processor and other elements of the server 24 may be linked and thus communicate over one or more communication buses. In this manner, for example, the processor may read/receive software from the memory for execution, receive inputs and provide outputs to the various I/O devices, receive information from or output information to external devices via the communication interface, etc. The one or more communication devices or interfaces permit the server 24 to communicate with the gaming machines 22 or other gaming devices, and preferably external devices, networks, systems and the like.

The casino server 24 may be configured to implement a variety of functionality (and/or there may be a plurality of different servers which each implement different functionality). For example, the casino server(s) 24 may implement player tracking functionality, accounting functionality, gaming functionality and the like. As one example, the casino may have a player rewards club which is implemented via a player tracking system. The casino server 24 may create and store player tracking account information (such as in the one or more databases which are associated with or accessible to the casino server 24), such as accounts which are associated with a particular player and include information about the player, such as player identity information (such may comprise, but is not limited to the player's name, address, phone number, email address, social security number or the like) and game play information. The game play information may be obtained from the gaming machines 22 or other gaming devices, such as by those devices reporting the player's game play information to the server 24 (such information may comprise, for example, number of games played, wagers made, winnings awarded, etc.). As is known, the player may be issued a player tracking card or other identifier which the player can use to identify themselves (and which is linked to their account). This identifier may be used, such as at the gaming machine 22, to identify the player so that the player's game play information can be matched or linked to their account. The casino may issue rewards to the player or the like based upon the player's game play (separate from winnings paid to the player for winning game outcomes).

Of course, the casino server(s) 24 might implement other functionality. As indicated, this might comprise accounting functionality. The accounting functionality might include tracking of wagers made and winnings paid at the gaming machines 22. In the case of a gaming system which includes the issuance of monetary value tickets or the like, the casino server 24 may generate ticket data, validate tickets and the like.

The system 20 may further comprise a vendor system V. The vendor system V may be a jackpot processing system. The vendor system V may be configured to aid in the generation and/or processing of data or information associated with payment and reporting of casino winnings (in this regard, while the term "jackpot" is used, such a term is not limited to a particular type or amount of winnings; as noted above, winnings may be required to reported, such as to one or more governmental entities or the like, at various levels or amounts, even those winnings may or may not be designated as jackpot wins in the game).

In one embodiment, the vendor system V may include one or more attendant devices 26 and one or more jackpot processing servers 28. The attendant devices 26 might comprise computing or communication devices. In a preferred embodiment, the attendant devices 26 are mobile or portable communication devices such as a tablet (but could comprise a laptop computer, a smart phone/PDA or the like). The attendant devices 26 may be general purpose devices which operate software for performing the particular functionality herein, but they could be special purpose or specially adapted devices. Such a device may comprise a controller or processor, a communication interface, a memory device (such as for storing machine readable code or "software" for execution by the processor, such as in the form of a downloaded software application), an input/output interface (such as for receiving input from a touch-screen, one or more buttons or the device or the like), and at least one video display. Preferably, the attendant devices 26 are capable of receiving user input—preferably including a player's signature, transmitting data and receiving data (such as via a communication interface), and displaying information or data, such as via their associated video displays.

The vendor system 28 may also include one or more jackpot processing servers 28. These servers 28 may be similar to the casino server(s) 24 noted above (such as including a processor, memory, communication interface, etc.). The jackpot processing server 28 preferably runs or executes software for implementing the functionality described herein. As further described below, the jackpot processing server 28 may be configured to implement or run an email application for transmitting one or more emails 32 over a network such as the Internet 30 to one or more customers. These emails 32 may include secure forms 34.

Additional aspects of the invention will be described with reference to FIG. 2, which is a flow diagram of one embodiment of a method or process in accordance with the invention. In a step S1, a notification of a gaming machine jackpot is reported and/or received. As one example, a player may play a gaming machine 22 such as that illustrated in FIGS. 1 and 10. The player may obtain a winning game outcome. The winning outcome and/or associated award may be reported, such as by the gaming machine 22 to the casino server 24. If the winning game outcome has an award over a designated amount, then either the gaming machine 22 and/or casino server 24 may detect or flag the outcome or award as requiring secondary validation, reporting or the like.

In one embodiment, the jackpot event is reported from the casino server 24 (although it might be reported directly from the gaming machine 22 or other gaming device) to the vendor's jackpot processing server 28. Casino personnel (such as a jackpot attendant) are also alerted to the jackpot win, such as by the casino server 24 and/or vendor jackpot processing server 28 sending a notification to the attendant device 26. If the attendant is not already logged in, the attendant may log into the device (such as by providing a user name and password). The notification might comprise an alert that a jackpot has been received at a particular gaming machine 22 within the casino and that jackpot confirmation is required by an attendant.

In one embodiment, one or more jackpot processing or game win related forms may be displayed to the attendant. For example, the jackpot processing server 28 may cause the attendant device 26 to display the forms. These forms may be transmitted to the attendant device 26, such as from the jackpot processing server 28 and/or reside on the device, where those forms are preferably populated with information. The information which is used to populate the forms may be stored by or obtained by the jackpot processing server 28 (either directly or as gathered from the casino server 24 and/or the attendant device 26), as in step S2. For example, the forms may include a W2G form which is populated with information regarding the player and the amount of the winnings (the information regarding the amount of the winnings and the player may be obtained, for example, by the jackpot processing server 28 from the casino server 24, including based upon the player's casino rewards account). The forms might alternatively comprise or include a jackpot payment receipt or other gaming win reporting form (which might be required by or requested by a gaming regulatory agency, other governmental agency, the casino or the like).

As noted, while the jackpot processing server 28 may obtain information from the casino server 24 or other sources, the information might be obtained by input to the attendant device 26. For example, the attendant may manually gather information from the player or have the player enter the information into the attendant device 26 in order to complete the required forms (which as noted may include government required reporting forms, casino release forms or other documents). For example, if the player does not have a player tracking account, the attendant may need to obtain information regarding the player's identity directly (such as one or more of the player's name, Social Security number, address, telephone number, email address, etc.).

As one example, when the attendant is notified of the jackpot, the attendant may travel to the gaming machine 22 which triggered the jackpot. The attendant may be prompted to confirm or obtain certain information. For example, the attendant may be prompted to confirm that the gaming machine 22 is showing a win matching the one reported to the system. The attendant may also be prompted to input or confirm certain information, such as basic player information, withholding data and the like. At this point, initial information provided by the attendant may be used by the jackpot processing server 28 to prepare and populate a draft of the gaming win forms. As noted, the forms may be generated in combination with player information obtained by the jackpot processing server 28 from other sources, such as the casino server 24. Once the initial draft of the form are prepared, they are preferably transmitted to the attendant's attendant device 26. At this time, the attendant and/or player may confirm the information which is displayed and, as appropriate, provide any missing information or update any incorrect information.

In one embodiment, once the forms are complete, the attendant captures the player's signature (directly onto the forms or for association with the forms), as in step S3. This may comprise having the player sign via a touchscreen of the attendant device 26 or by providing other input (such as by the player accepting an e-signature). The completed form(s) or associated information is then transmitted from the attendant device 26 back to the jackpot processing server 28, as in step S4. The jackpot processing server 28 may store the completed forms, such as in association with one or more transaction records, may transmit the forms to the casino, and/or may transmit the forms to the appropriate authorities (such as the IRS). Also, once the forms have been completed, if the jackpot is a 'hand pay' jackpot, the attendant may be notified that the jackpot can be paid or issued. In one embodiment, the player's signature may be associated with one or more of the forms. For example, in order to protect the casino, the casino may require the player to provide their signature relative to one or more forms or authorizations by which the player acknowledges that their identity information is correct, that they have been paid in full for the awarded jackpot, or other acknowledgements.

In some embodiment, not all forms may be displayed and sent back and forth between the attendant device 26 and the jackpot processing serer 28 as described above. For example, in one embodiment, the attendant might input or confirm jackpot and player information via the attendant device 26. The jackpot processing server 28 might initially transmit or cause the attendant device 26 to display a jackpot form to the player, which form includes information regarding the player, the jackpot, tax information (such as withholding basis and amounts) and the like. The player might sign that form and, in response to receiving the completed jackpot form, the jackpot processing server 28 might then generate official reporting forms, such as required reporting forms for gaming regulators and tax forms such as the W2G.

In a step S5, if not already done (such as in step S2) the jackpot processing server 28 preferably collects personal information regarding the player. This information may be obtained from the casino server 24. Alternatively or in combination, the information might be obtained from the player, such as based upon information that the player provided to the attendant and which was input to the attendant device 26. This information may comprise one or more of the player's name, address, phone number, email address, Social Security number and the like.

In a step S6, a security code is preferably generated from the player's personal information (such as by software code executed by the jackpot processing server 28). The security code may comprise all or portions of one or more player identification elements, such as all or part of the player's name, address, telephone number and social security number. As one example, the player's information might comprise: John Doe; 111 Main Street, Las Vegas, Nev., 89101;

Telephone 555-444-3333; Social Security number 999-88-7777. The security code might comprise, for example: JDOE1117777, comprising the first letter of the player's first name, the last name of the player, the street number and the last four digits of their social security number. Of course, various combinations of the player's information may be used. Preferably, the information which is used to create the security code is associated with the player, is known to the player, and at least part of the information is preferably generally not known to third parties (such as the player's social security number).

In a step S7, the reporting forms are preferably secured using the security code. This may comprise, for example, using the security code as a password for a secure PDF document or using the security code as a password for other types of documents or for use in generating other types of security elements which generally prevent access to the forms without providing the required security code. For example, the security code could be used to create an encryption key which is used to encrypt the form or data, and which code can be used by the user to create a key which can decrypt the data.

In a step S8, the one or more secure forms are preferably electronically transmitted to the player. Preferably, this comprises emailing of the secure forms to the player. The email may include the one or more secure forms as an attachment. The body of the email may include instructions to the player regarding how to access the forms using the security code. For example, relative to using a security code to unlock a PDF document, the instructions might say: to open the attached forms, please enter the security code that is the first letter of your first name, your last name, your street number and the last four digits of your social security number. Such an email might be transmitted via an email program which runs on the jackpot processing server 28 or an associated device. In a preferred embodiment, the email is transmitted from an account of the casino (and not the vendor), such as by the jackpot processing server 28 transmitting the secure form or email information to the casino server 24 for processing/transmission.

Of course, the completed/processed forms might also be provided to other entities. For example, the jackpot processing server 28 may transmit completed reporting forms to the IRS, gaming authorities or like (either directly, or by providing such forms to the casino, such as via the casino server 24) for reporting.

Figure 2:
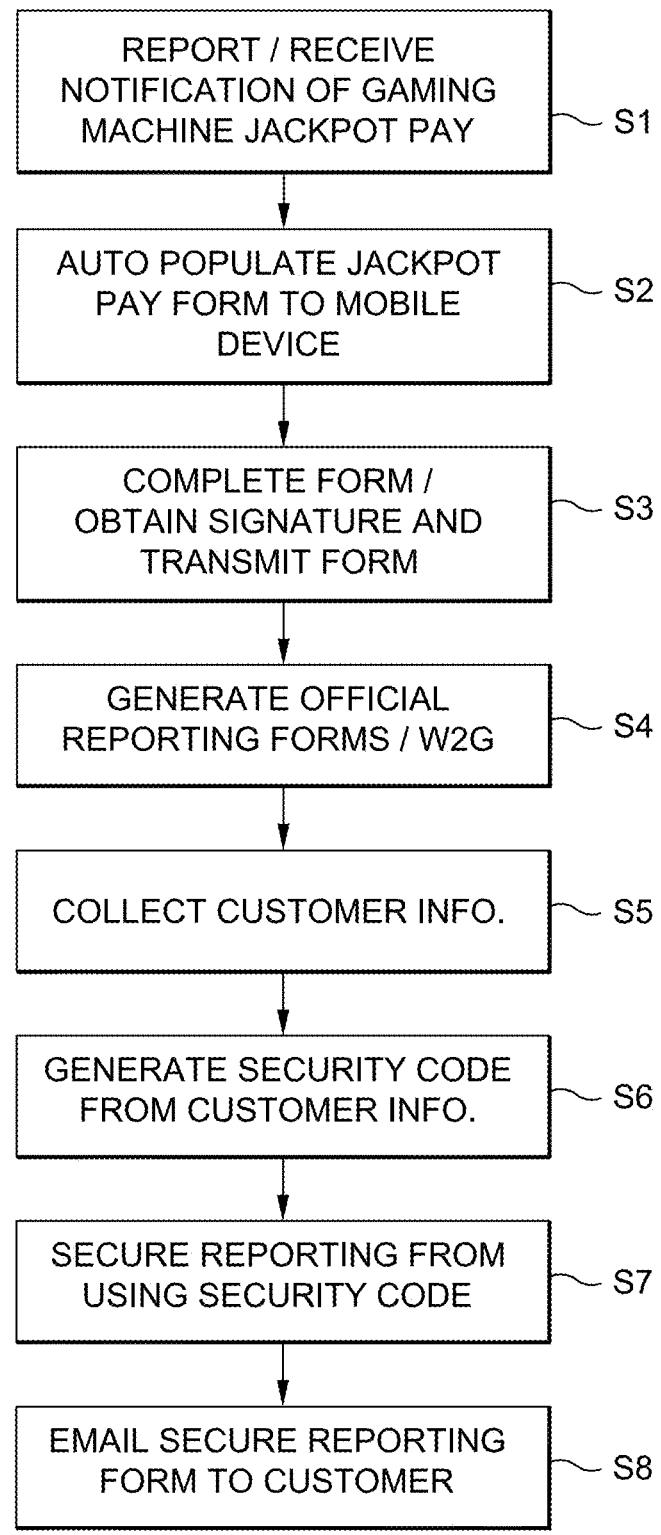
FIG. 2 is a flow chart which illustrates one embodiment of a process of the invention.

It will be appreciated that the process illustrated in FIG. 2 and described above is one embodiment of the invention and various of the steps might be performed in different orders and/or that the process might include other steps, including additional steps.

Preferably, in accordance with the invention, the process of storing the completed form(s) and/or generating associated reporting forms is automated, as are the steps of generating the security code from collected player information, securing the form(s) and transmitting the secured forms to the player.

In another embodiment of the invention, step S6 may comprise collecting a security code from the player. In this embodiment, as part of the process of completing the forms (such as part of step S3), the player might be instructed to generate or input a password. The player might then select a particular password and enter it into the attendant device 26. The password may then be forwarded to the jackpot processing server 28. In that event, step S5 may be omitted or the jackpot processing server 28 may still gather player information, such as the player's email address if that information is not already known or stored. Then in step S7, the reporting forms are preferably secured using the security code that was generated and/or inputted by the player. When the secure reporting forms are emailed to the client in step S8, the email may remind the player that the forms may be accessed using the password which the player provided to the casino attendant at the time the jackpot reporting forms were completed.

In another embodiment of the invention, the secure document or form might be transmitted to the player via means other than an email. In one alternate embodiment of the invention, such as where the player's phone number is known (such as from their player tracking account) or is collected from the player, the document or form might be transmitted to the player's mobile phone/tablet or the like via text message (such as transmitted from the jackpot processing server 28 or the attendant device 26). In yet another embodiment, the secure document or form might be transmitted directly to the player's device via a wireless communication link, such as Bluetooth or Wi-Fi, such as from attendant device 26 (for example, in one embodiment, the jackpot processing server 28 may generate the documents or forms and secure them and then transmit them to the attendant device 26, at which point the attendant may transmit the documents or forms to the player's device).

A particular advantage of the invention is that a player is provided with an electronic copy of jackpot related forms, such as a generated W2G document. This avoids the need for the player to later request a copy of the form from the casino. More importantly, the jackpot related forms are transmitted in a protected format, whereby any sensitive information associated with the form(s) is secured (both during transport of the form(s) to the player and at the player's mailbox), such as by having the forms secured with a password, encryption or the like. Thus, the player does not risk dropping a printed form that bears their personal information in a casino or having an electronic form intercepted by a third party.

In one embodiment, the generated secured forms may also be stored so that a player can later re-request the forms in an automated fashion for automated response. In that event, the vendor or casino might operate a web portal which allows the player to make a request for the casino or vendor to resend the forms. The previously generated and transmitted secure forms might then be obtained, such as from electronic files which are accessible based on the player's identity and the secured forms might then be re-transmitted to the player automatically by the system.

Another aspect of the invention is the use of an attendant controlled attendant device 26. In many cases, despite the attempt to fully automate the form generation process, one or more elements of required information may not be available for generating the form(s) (such as from the player tracking database, etc.). In accordance with the invention, an attendant an interact with the player in real-time in order to directly obtain any missing information in order to immediately complete the forms. Moreover, the attendant can use the device 26 to obtain a player's acknowledgement—preferably in the form of their signature—as to various aspects of the transaction.

Another advantage to the use of the attendant and a mobile attendant device 26 is that the attendant may also directly verify the player's identity, such as by viewing the player's driver's license or other ID. For example, a minor might utilize their father's player tracking card and play a gaming machine. When a jackpot is won, the system may associate the win with the father. The attendant may request the ID of the player and determine that the player is not the father, but is instead a minor—at which point the jackpot may be voided. In other embodiments, the attendant may use the attendant device 26 to view the player information which is associated with the forms and compare that information to directly gathered information, such as the player's full name and address on their driver's license. For example, the attendant may see that the address which is associated with the forms is different than the address which is on the player's drivers license. The attendant may thus confirm with the player which address is their current address (for example, the address in the player tracking database may be out of date) and then update the address into the device 26, such as to update it in the forms (and potentially in the player tracking database). In one embodiment, the attendant might be requested to verify the player's identity at the beginning of the process.

For example, when the attendant travels to the gaming machine 22, they may be required to confirm the amount of the jackpot and the machine serial number and also an identity of the player. As noted, the attendant might review player identification, or input identity information (such as a Social Security number) or scan an identification card (such as with a card reader or optical reader/image capture device of the attendant device 26. This information may be used by the jackpot processing server 28 to confirm the identity of the player and/or that they are entitled to be awarded the jackpot (such as based upon their age, if they are on a banned player list, etc.). Of course, verification might be accomplished by processing this information remotely. For example, the attendant device 26 and/or jackpot processing server 28 might transmit a driver's license ID scan to a remote service which provides a confirmation (such as via interface with state ID systems) that the ID is valid and of the player's identification. Preferably, the collected player identification information and verification results are stored, such as in a database associated with the jackpot processing server 28.

Figure 3:
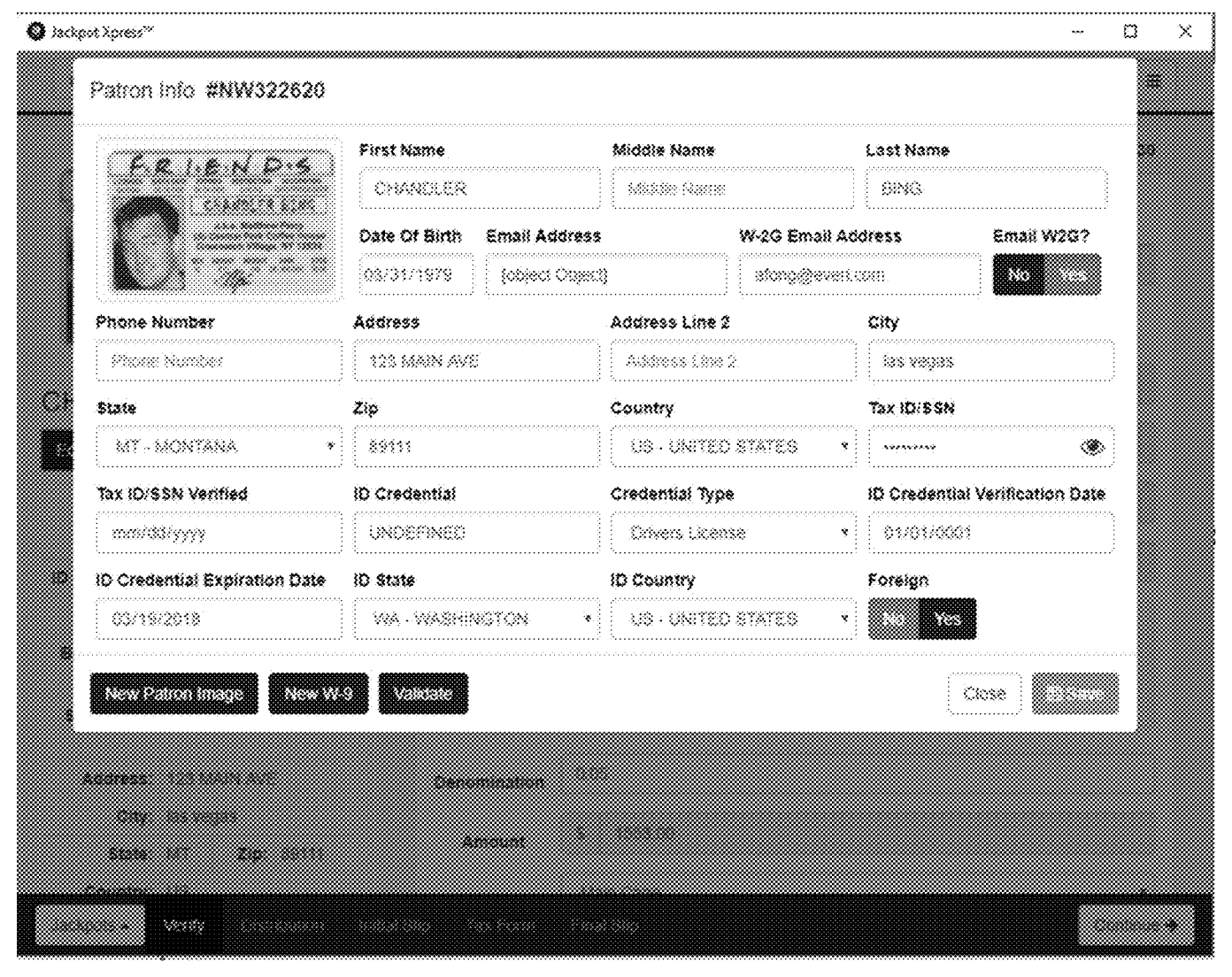

FIGS. 3-9 illustrate additional aspects of the invention. FIG. 3 illustrates one embodiment of a graphical user interface which may be displayed by the attendant device 26. This interface is an "edit patron" interface which allows the attendant to confirm the player's information and/or update the player's information and provide other information. The interface may be populated with basic information provided by the jackpot processing server 28. The attendant may then update or add information. For example, if the system does not have a stored image of the player's ID (such as their driver's license), the attendant might scan it as indicated herein. As indicated, the attendant may update or provide such information as the player's full name, address, Social Security number, ID information, email address (in this case, the player may provide a normal correspondence email address and a separate email address to which their tax forms may be emailed—this might comprise, for example, a secure email address). As indicated, the attendant might obtain a preference from the player as to whether they wish to have their win forms emailed.

Figure 4:
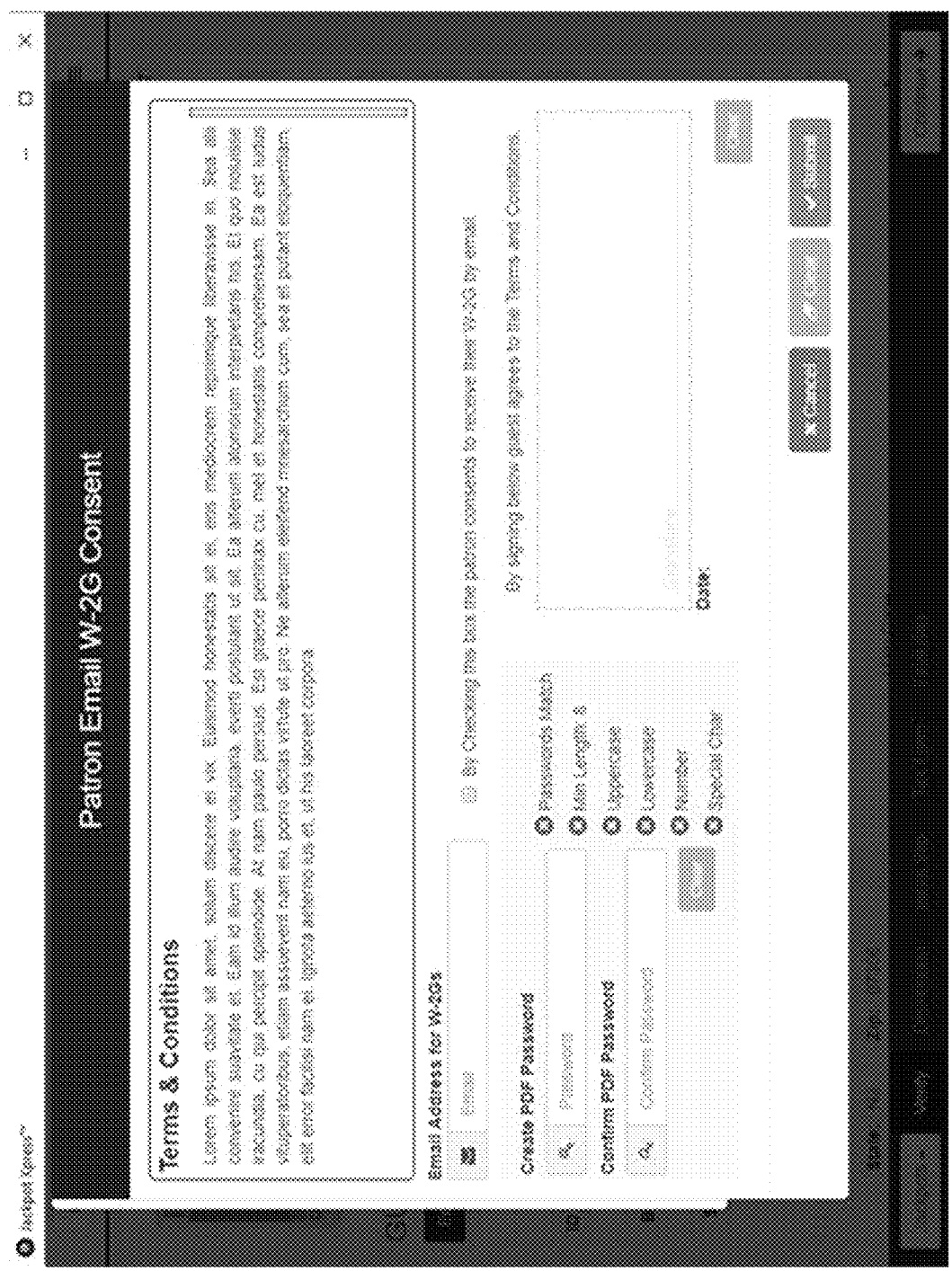

As illustrated in FIG. 4, if the player has elected to have their forms emailed to them, a consent form may be displayed at the attendant device 26. The consent form may indicate the terms and conditions that the player must accept in order to proceed. As illustrated, in this embodiment the player may designate or select their own password.

Figure 5:
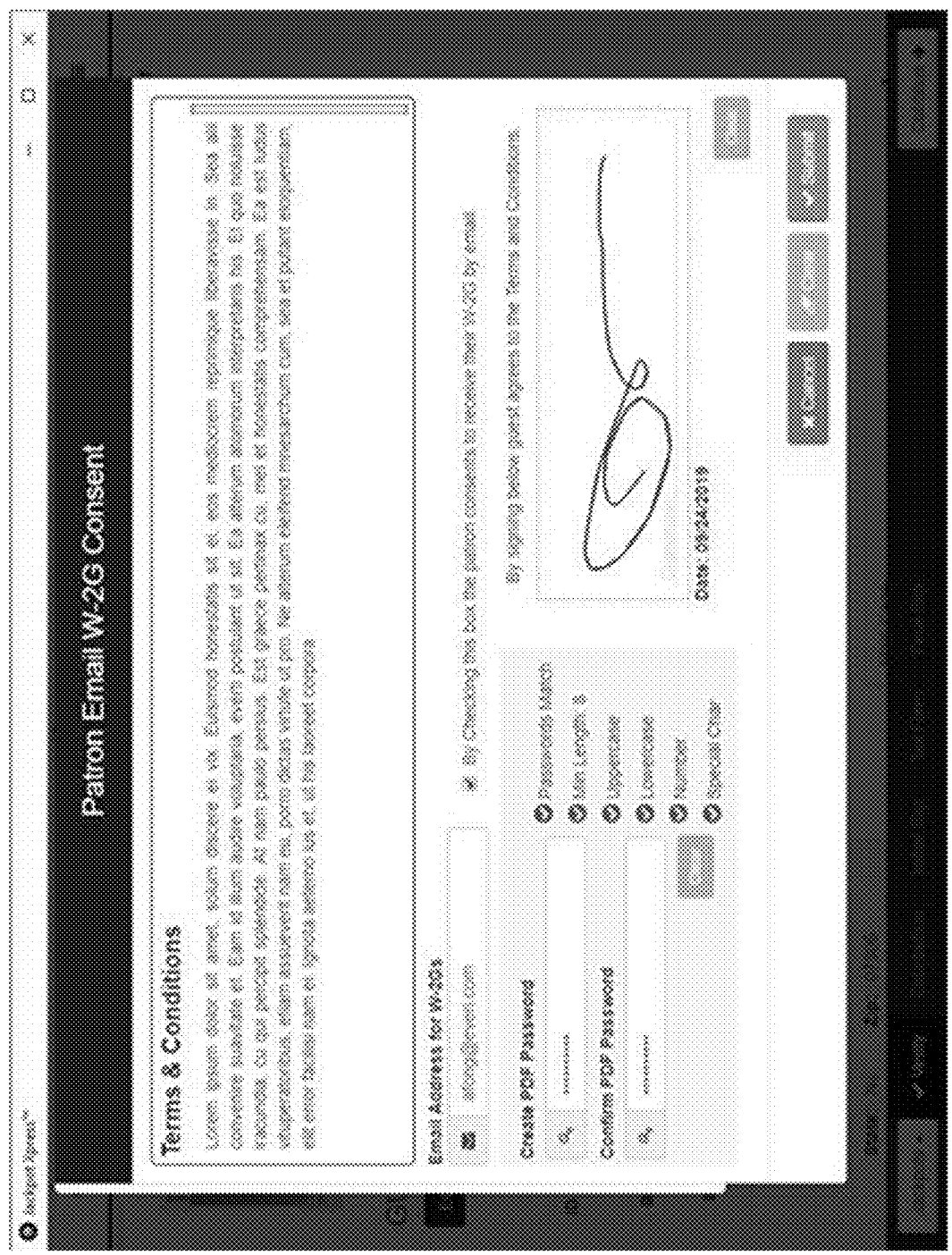

FIG. 5 illustrates the form in FIG. 4 as updated with the player's signature. As noted herein, the player might sign via a touch-screen of the attendant device 26. The signed form (or at least the player's signature) may be captured and transmitted to the jackpot processing server 28 as detailed herein.

Figure 6:
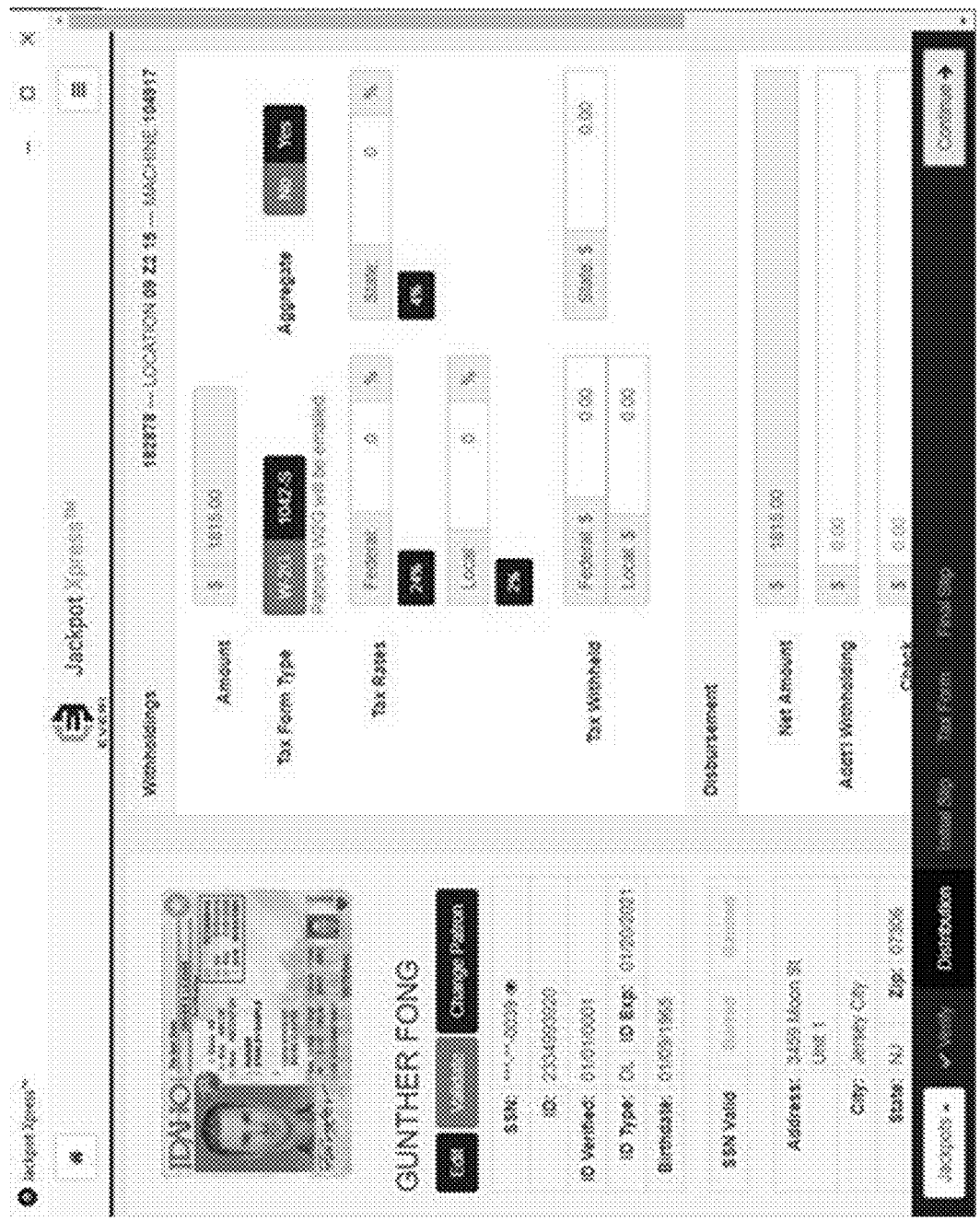

FIG. 6 illustrates another graphical interface which may be displayed by the attendant device 26. This interface may include information generated by the jackpot processing server 28, such as tax withholding information based upon the amount of the jackpot/award and tax rates. This interface may be presented to the player so that they are aware of the amount of taxes that will be withheld from the payment to them. Further, the attendant may modify various data.

As indicated herein, the jackpot processing device 28 generates the various game win forms. For example, after any modification to the tax withholding information as illustrated in FIG. 6 and based upon confirmation of the player information in FIG. 3, the jackpot processing server 28 would generate various forms, such as an IRS Form W2G and/or other reporting forms.

Figure 7:
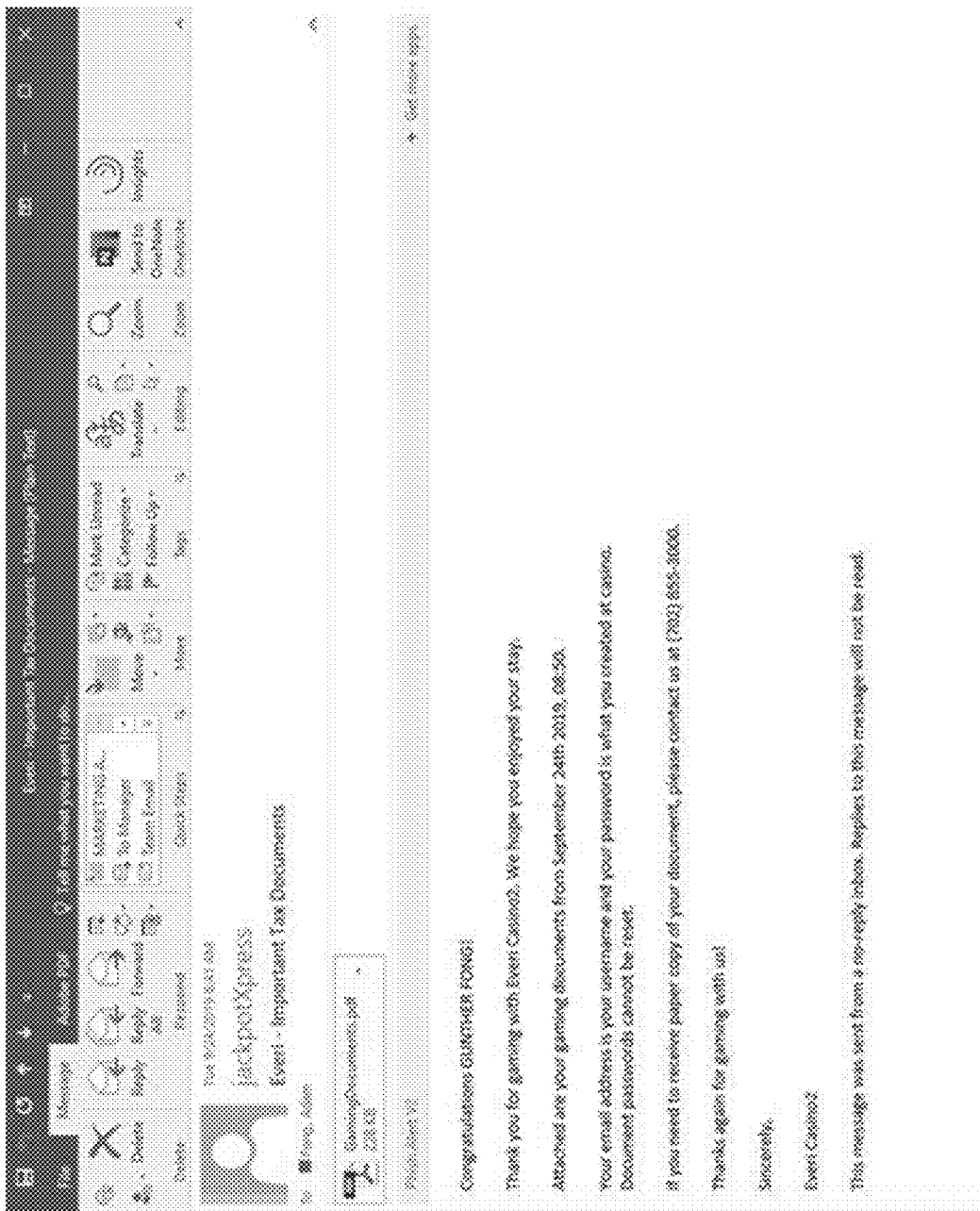

As indicated herein, the form is secured and then is provided to the player, preferably by email. FIG. 7 illustrates one example of an email to a player which has a secured W2G form attached. In this case, the W2G form is a PDF form which is password protected.

Figure 8:
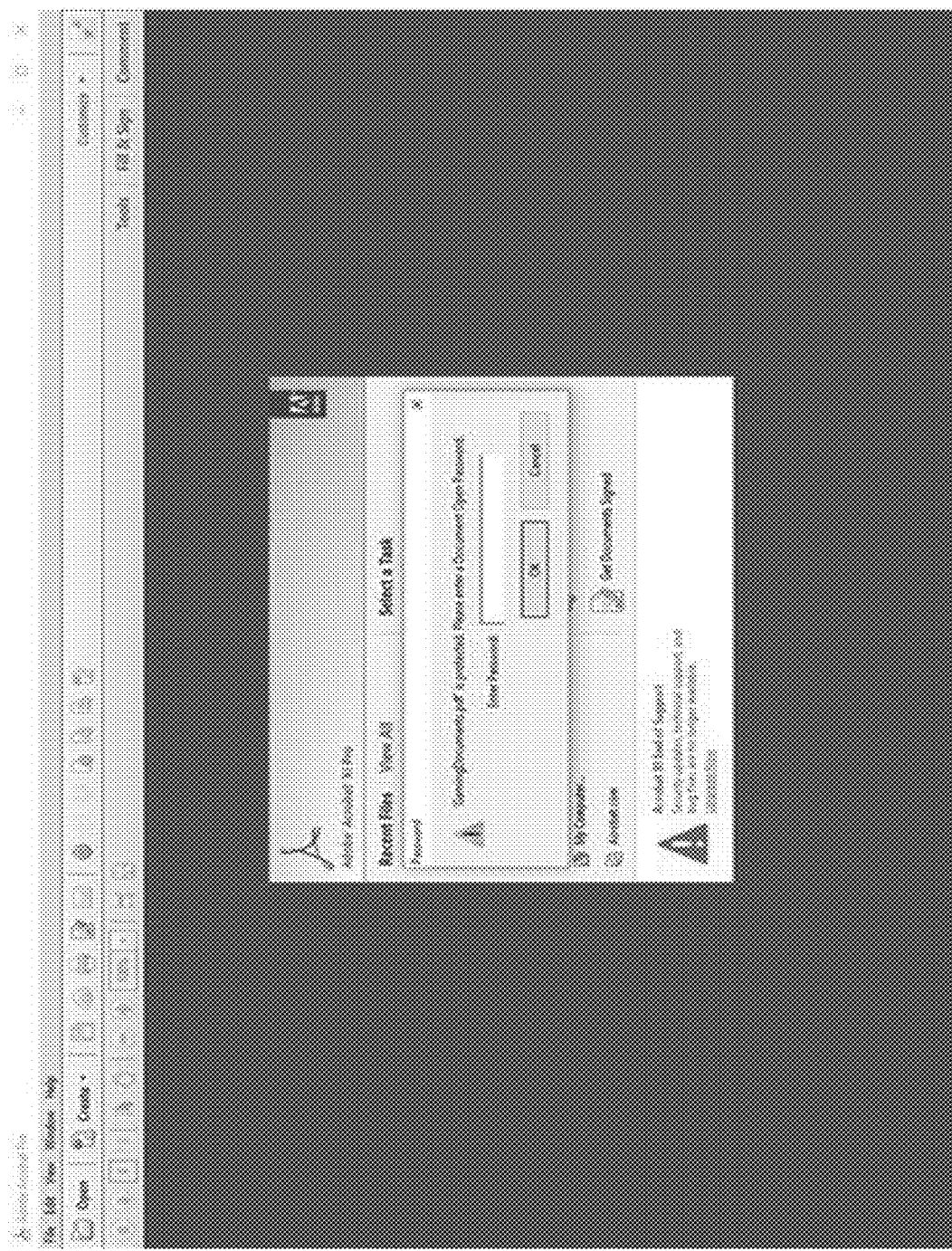
Figure 9:
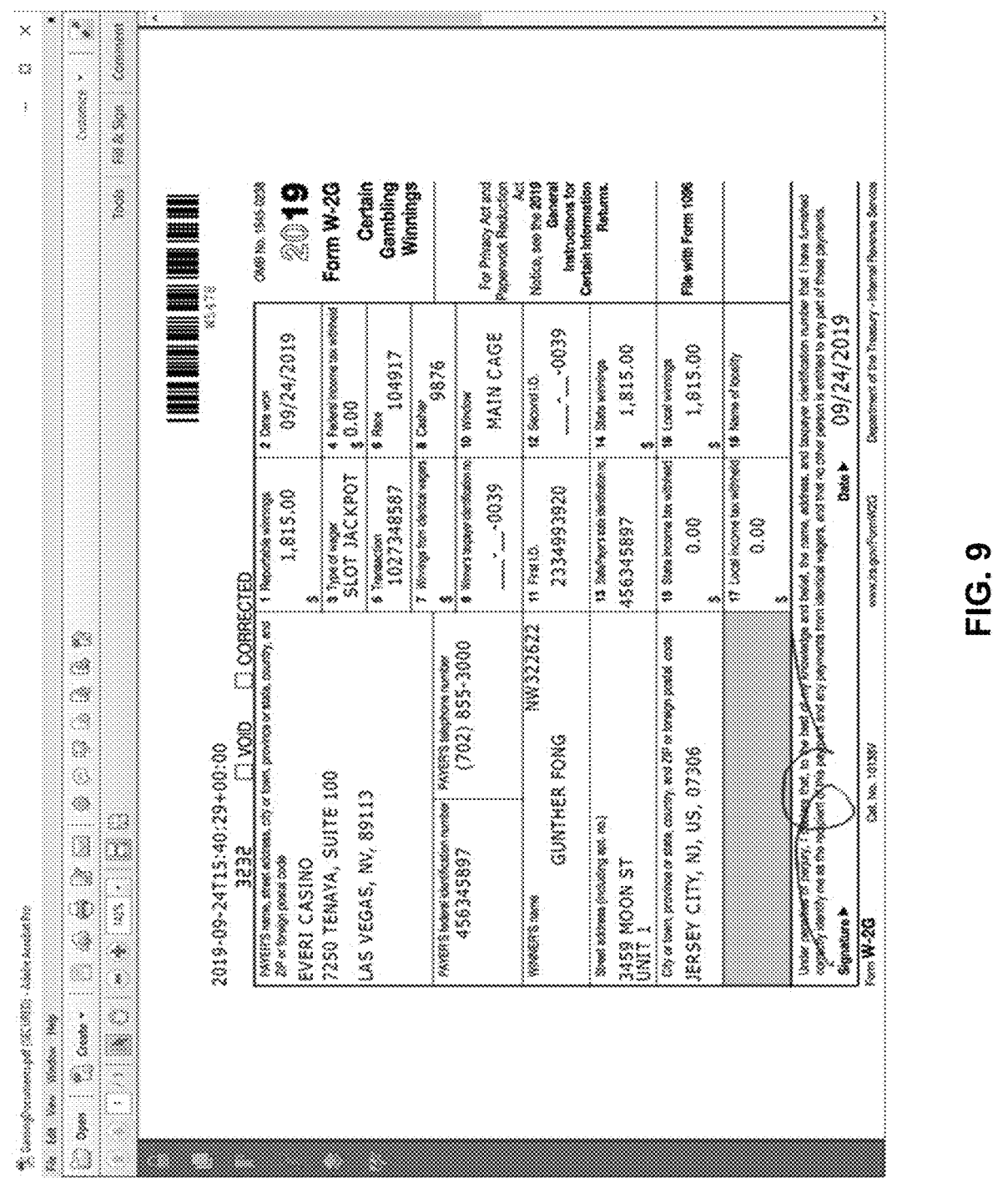

As illustrated in FIG. 8, when the player attempts to open the form, they are prompted to provide their password. Having provided their password, the W2G is displayed to the player, as in FIG. 9 (at which point the player may review, print, store, etc., the form).

Additional aspects of the invention will now be described. As indicated, the invention may be implemented relative to a casino system having one or more gaming machines or other devices for use in presenting wager-based games. As noted, the invention may be applied in a variety of environments. While the example above referenced a gaming machine 22 in a casino, the process may apply to a jackpot awarded at a gaming table or other device and at locations other than casinos (for example, the process might be applied to a video lottery terminal at which a video lottery game is played, a terminal at which a game of bingo is presented, etc.).

Figure 10:
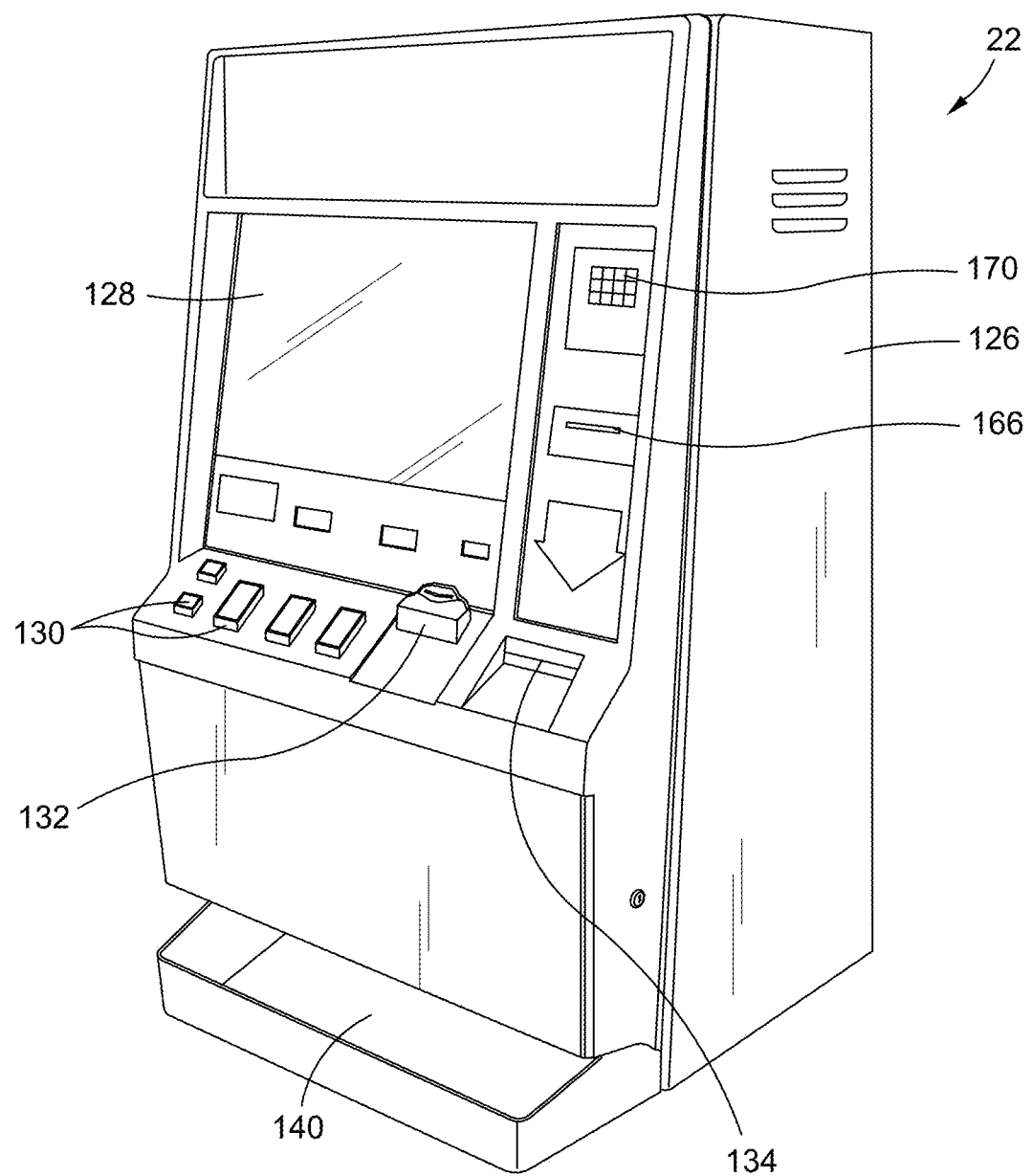
FIG. 10 illustrates one embodiment of a gaming machine which may form a portion of the system illustrated in FIG. 1.

One configuration of a gaming machine 22 is illustrated in FIG. 10. As illustrated, the gaming machine 22 generally comprises a housing or cabinet 126 for supporting and/or enclosing various components required for operation of the gaming machine. In the embodiment illustrated, the housing 126 includes a door located at a front thereof, the door capable of being moved between an open position which allows access to the interior, and a closed position in which access to the interior is generally prevented. The configuration of the gaming machine 22 may vary. In the embodiment illustrated, the gaming machine 22 has an "upright" configuration. However, the gaming machine 22 could have other configurations, shapes or dimensions (such as being of a "slant"-type, "bar-top" or other configuration as is well known to those of skill in the art).

The gaming machine 22 preferably includes at least one display device 128 configured to display game information. The display device 128 may comprise an electronic video display such as a cathode ray tube (CRT), high resolution flat panel liquid crystal display (LCD), projection LCD, plasma display, field emission display, digital micro-mirror display (DMD), digital light processing display (DLP), LCD touchscreen, a light emitting display (LED) or other suitable displays now known or later developed, in a variety of resolutions, sizes and formats (e.g. 4:3, widescreen or the like). The display 28 may be capable of projecting or displaying a wide variety of information, including images, symbols and other indicia or information associated with game play, game promotion or other events. The gaming machine 22 might include more than one display device 128, such as two or more displays 128 which are associated with the housing 26. The gaming machine 22 might also include a top box or other portion. Such a top box might include one or more display devices 128, such as in addition to one or more main displays which are associated with the housing 126. Also, the gaming machine 22 might include side displays (such as mounted to the exterior of the housing 126) and might include multiple displays of differing sizes.

While the display devices may comprise one or more video displays, (such as for presenting video poker, video slots or other video-based games) in another embodiment, the gaming machine 22 may include one or more physical reels capable of displaying game information, such as slot symbols. In such a configuration, means are provided for rotating the physical reels. In one or more embodiments, the means may comprise a mechanical linkage associated with a spin arm, with movement of the spin arm (a "pull") by a user causing the reels to spin. In such an arrangement, the reels are generally allowed to free-wheel and then stop. In another embodiment, electronically controlled mechanisms are arranged to rotate and stop each reel. Such mechanisms are well known to those of skill in the art. In this arrangement, actuation of the spin arm or depression a spin button causes a controller (not shown) to signal the activation of the spin mechanism associated with one or more of the reels. Preferably, the controller is arranged to either turn off the signal to the device(s) effecting the rotation of each or all of the reels or generates a signal for activating a braking device, whereby the reels are stopped. The principal of such an arrangement is described in U.S. Pat. No. 4,448,419 to Telnaes, which is incorporated herein by reference.

As described in more detail below, the gaming machine 22 is preferably configured to present one or more games upon a player making a monetary payment or wager. In this regard, as described in more detail below, the gaming machine 22 includes a mechanism or means for accepting monetary value.

In one embodiment, certain game outcomes (but preferably not all game outcomes) may be designated as winning outcomes (the non-winning outcomes may be referred to as losing outcomes). Prizes or awards may be provided for winning outcomes, such as monetary payments (or representations thereof, such as prize of credits), or promotional awards as detailed herein. As detailed below, the gaming machine 22 preferably includes a mechanism or means for returning unused monetary funds and/or dispensing winnings to a player. As noted herein, certain awards may require reporting and may require secondary validation in order to be rewarded.

The gaming machine 22 preferably includes one or more player input devices 130 (such as input buttons, plunger mechanisms, a touch-screen display, joystick, touch-pad or the like). These one or more devices 130 may be utilized by the player to facilitate game play, such as by providing input or instruction to the gaming machine 22. For example, such input devices 130 may be utilized by a player to place a wager, cause the gaming machine 22 to initiate a game, to indicate cards to be held or discarded, to "cash out" of the gaming machine, or to provide various other inputs.

In one preferred embodiment, the gaming machine 22 includes at least one microprocessor or controller for controlling the gaming machine, including receiving player input and sending output signals for controlling the various components or peripheral devices of the machine 22 (such as generating game information for display by the display 128). The controller may be arranged to receive information regarding funds provided by a player to the gaming machine, receive input such as a purchase/bet signal when a purchase/bet button is depressed, and receive other inputs from a player. The controller may be arranged to generate information regarding a game, such as generating game information for display by the at least one display 128 (such as information comprising dealt or displayed cards, slot symbols, dice or other game indicia), for determining winning or losing game outcomes and for displaying information regarding awards for winning game outcomes, among other things.

The controller may be configured to execute machine readable code or "software" or otherwise process information, such as obtained from a remote server. Software or other instructions may be stored at a memory or data storage device, e.g. in a fixed or non-transitory configuration. The memory may also store other information or data, such as data stored in table or other forms (including, but not limited to look-up tables, pay tables and other information, including tracked game play information). The gaming machine 22 may also include one or more random number generators for generating random numbers (such as implemented by a random number generator software module stored in the memory and executable by the processor or controller), such as for use in selecting slot symbols, cards or other game symbols and for presenting the game in a random fashion (e.g. whereby the game is presented in a manner in which the player cannot control the outcome) or pseudo-random fashion (e.g. such as where the game includes a skill component which can affect the outcome of the game).

Preferably, the controller is configured to execute machine readable code or instructions (e.g. software) which are configured to implement the game. In this regard, the gaming machine is specially configured to present the game of the invention via specific software and/or hardware which causes the gaming machine to operate uniquely. For example, the controller of the gaming machine 22 may be configured to detect a wager, such as a signal from a player's depressing of the "bet one" button (such as one of the buttons 132). Upon such an event and/or the player otherwise signaling the gaming machine to present the game, the controller may be configured to cause the at least one display 28 to display unique information, such as a unique graphical interface or unique game display, including game symbols or other game information (such as graphically represented images of cards, slot symbols, dice, etc.). The controller may accept input from a player of game inputs, such as a request to spin reels or the like, via the one or more player input devices of the gaming machine 22. As indicated above, the machine readable code may be configured in various manners, such as by having various "modules" of software which are designed to implement specific features of the game play or game presentation.

The gaming machine 22 may be configured to generate and present games in a stand-alone manner or it may be in communication with one or more external devices at one or more times. For example, the gaming machine 22 may be configured as a server based device and obtain game code or game outcome information from a remote game server (in which event the gaming machine controller may receive game information from the server, such as game outcome information, and use that server-generated information to present the game at the gaming machine). For example, the gaming machine 22 might be configured as a stand-alone device or as a server-based device for presenting games as Class III games (as defined by the U.S. Indian Gaming Regulatory Act) or as a server-based device for presenting games as Class II games (as defined by the U.S. Indian Gaming Regulatory Act).

As indicated, the gaming machine 22 is configured to present one or more wagering games. The gaming machines 22 is preferably configured to accept value, such as in the form of coins, tokens, paper currency or other elements or devices representing value such as monetary funds. Thus, as indicated above, the gaming machine 22 preferably includes a mechanism or means for accepting monetary value. For example, as illustrated in FIG. 10, the gaming machine 22 might include a coin acceptor 32 for accepting coins. Of course, associated coin reading/verifying devices and coin storage devices may be associated with the gaming machine 22 if it is configured to accept coins. Likewise, the gaming machine 22 might include a media reader 134. Such a reader may be configured to accept and read/verify paper currency and/or other media such as tickets. Of course, in such event the gaming machine 22 may further be configured with one or more paper currency or ticket storage devices, such as cash boxes, and other paper currency or media handling devices (including transport devices).

The gaming machine 22 might also be configured to read FOB s, magnetic stripe cards or other media having data associated therewith and via which value or funds may be associated with the gaming machine 22. The mechanism for accepting monetary value might also comprise hardware and/or software which allows a player to transfer (such as electronically) funds from an account, such as a casino wagering account, or a bank or other financial institution account. Such a mechanism might include a communication interface which permits the gaming machine to communicate with a mobile phone, PDA, tablet or other electronic device of the player (such as via a physical interface or wired or wireless communications links, such as to enable the transfer of funds from the player to the gaming machine or system).

When the player associates funds with the gaming machine or an associated system, a credit balance is generated. The credit balance may comprise a plurality of monetary value credits. The player may wager some or all of the associated monetary value, such as by wagering one or more of the credits associated with the credit balance. For example, the player might provide input to a wager button or touch screen interface to wager a certain number of credits (such as "Bet 1 Credit", "Bet 5 Credits", "Bet Maximum Credits" or other options). In one embodiment, when the player's wager is received, the player's credit balance is reduced by the number of wagered credits. The player might then provide a separate input to begin the game. In other embodiment, the player might select a "play game" input, such as by pressing a "spin" button, which input is taken to comprise both an instruction to place a wager (such as of a pre-set or pre-selected number of credits) and to start the game. Of course, other configurations may be implemented for accepting monetary value from the player and for allowing the player to place a wager from the associated monetary value.

In one embodiment, the gaming machine 22 is configured to award winnings for one or more winning wagering game outcomes. Such winnings may be represented as credits, points or the like. In one embodiment, the player may "cash out" and thus remove previously associated funds and any awarded winnings or such may otherwise be paid to the player. These winnings may be associated with the player's credit balance, thus increasing the player's credit balance.

As noted above, certain awards, such as larger awards or "jackpots" (which may be awarded based upon a paytable, a single or multiple game or gaming device progressive jackpot or the like) may only be awarded (either credited or paid via a hand pay or other means of payment) if the jackpot is confirmed and associated reports are generated as in the manner described herein.

In one embodiment, the player may provide an input to the gaming machine 22 to indicate their desire to cash out, such as by selecting a "cash out" button (such as implemented via one of the buttons 130) or touch screen feature or providing other input. In response, a monetary value represented by the player's credit balance or the like is preferably paid, transferred or otherwise provided to the player. For example, upon an award or at cash-out, associated funds may be paid to the player by the gaming machine 22 dispensing coins to a coin tray. In another embodiment, funds may be issued by dispensing paper currency or other media. In yet another embodiment, a player may be issued a media, such as a printed ticket, which ticket represents the value which was paid or cashed out of the machine. The aspects of gaming machine "ticketing" systems are well known. One such system is described in U.S. Pat. No. 6,048,269 to Burns, which is incorporated herein in its entirety by reference. In yet another embodiment, the cash-out might result in the dispensing of a card or other media which stores or represents the cashed-out funds, such as by writing funds information to a magnetic stripe of a card which is inserted into a media writer of the gaming machine or dispensed from the machine. In other embodiments, the cash-out mechanism may result in the funds value being transferred to an external device or account, such as a player's casino account (such as associated with a casino server), a remote bank or other financial account, or an electronic device such as a player's phone, PDA or tablet.

The gaming machine 22 may also include a player tracking device, such as a card reader 166 and associated keypad 170. Such player tracking devices are well known and may permit the game operator to track play of players of the gaming machine. The tracked play may be utilized to offer player bonuses or awards.

A casino may have numerous such gaming machines 22, such as located on a casino floor or in other locations. Of course, such gaming machines 22 might be used in other environments, such as an airport, a bar or tavern or other locations.

It will be appreciated that the gaming machine illustrated in FIG. 10 is only exemplary of one embodiment of a gaming machine. For example, it is possible to for the gaming machine to have various other configurations, including different shapes and styles and having different components than as just described.

The gaming machine 22 may, as noted above, be part of a system which includes other devices. For example, the gaming machine 22 may communicate with one or more casino systems, such as a player tracking server or system, an accounting system or server, a ticketing system, a bonusing system, a tournament system, other gaming machines, and external devices.

The invention may have other configurations than explicitly described above. For example, instead of having separate casino and vendor systems, the functionality described herein may be implemented directly via a casino operator via their casino system, or the vendor functionality might be integrated into the casino system. The functionality herein may also be implemented relative to other gaming devices such as gaming tables, keno/bingo systems and the like.

It will be understood that the above described arrangements of apparatus and the method there from are merely illustrative of applications of the principles of this invention and many other embodiments and modifications may be made without departing from the spirit and scope of the invention as defined in the claims.

What is claimed is:

1. A system for generating and securely transmitting gaming win reporting forms to a player comprising:
   a mobile attendant device, said attendant device comprising a processor configured to execute machine readable code, a memory, a display device, at least one user input device and machine-readable code stored in said memory and executable by said processor;
   a jackpot processing server comprising a processor configured to execute machine readable code, a memory, a communication interface, and machine readable code stored in said memory said executable by said processor;
   said machine readable code of said jackpot processing server configured to cause said processor thereof to, in response to receiving an indication of an occurrence of a designated game win by a player, collect information regarding said player from a remote source and cause said mobile attendant device to display one or more game win forms relating to said game win, said one or more game win forms populated with said information regarding said player and information regarding said game win;
   said machine readable code of said mobile attendant device configured to cause said processor thereof to receive a player's signature relative to said one or more game win forms via said at least one user input device;
   said machine readable code of said mobile attendant device configured to cause said processor thereof to transmit confirmation of said one or more game win forms to said jackpot processing server; and
   said machine readable code of said jackpot processing server configured to secure said one or more game win forms using a security code and to allow access to said one or more game win forms based upon receipt of said security code from said player.

2. The system in accordance with claim 1 wherein said information regarding said player is obtained from a casino player tracking account via communication by said jackpot processing server with a casino player tracking server.

3. The system in accordance with claim 1 wherein said machine readable code of said jackpot processing server is configured to cause said processor of said jackpot processing server to cause said one or more game win forms to be transmitted to a device of said player.

4. The system in accordance with claim 1 wherein said machine readable code of said jackpot processing server is configured to cause said processor of said jackpot processing server to email said one or more game win forms to said player.

5. The system in accordance with claim 1 wherein said mobile attendant device comprises a hand-held attendant device.

6. The system in accordance with claim 1 wherein said user input device of said mobile attendant device comprises a touch-screen.

7. The system in accordance with claim 1 wherein said machine readable code of said mobile attendant device is configured to cause said processor of said mobile attendant device to receive input from an attendant of additional information regarding said player.

8. The system in accordance with claim 7 wherein said additional information comprises identity information.

9. A method for generating and securely transmitting gaming win reporting forms to a player comprising the steps of:
   generating, at a jackpot processing server, a gaming win reporting form in response to a gaming win by a player;
   displaying said gaming win reporting form at a mobile attendant device operated by an attendant;
   receiving a signature by said player relative to said gaming win reporting form via said mobile attendant device;
   storing said gaming win reporting form and said player's signature in a database associated with said jackpot processing server;
   generating a security code at said jackpot processing server, said security code used by said jackpot processing server to control access to said gaming win reporting form;
   receiving said security code from said player; and
   permitting said player to access said gaming win reporting form.

10. The method in accordance with claim 9 further comprising receiving notification of a gaming win at said jackpot processing server and said jackpot processing server causing said mobile attendant device to display said gaming win reporting form.

11. The method in accordance with claim 10 further comprising said jackpot processing server collecting information regarding said player from a secondary source and causing said mobile attendant device to display said gaming win reporting form populated with said information regarding said player.

12. The method in accordance with claim 11 wherein said secondary source comprises a player tracking system.

13. The method in accordance with claim 12 wherein said player tracking system comprises a player tracking server and a player tracking database of player information.

14. The method in accordance with claim 11 wherein said step of permitting said player to access said gaming win reporting form comprises transmitting said form to a device of said player.

15. The method in accordance with claim 14 wherein said step of permitting said player to access said gaming win reporting form comprises emailing said gaming win reporting form to said player.

16. The method in accordance with claim 10 wherein said security code is received from a remote electronic device of said player.

17. The method in accordance with claim 10 further comprising receiving input from said attendant of secondary information regarding said player to said mobile attendant device.

18. The method in accordance with claim 17 further comprising associating said secondary information with said gaming win processing form.

19. The method in accordance with claim 10 wherein said gaming win processing form comprises one or more of a W2G form and a jackpot payment receipt.

20. The method in accordance with claim 10 wherein said step of receiving said signature comprises receiving said signature via a touch-screen of said mobile attendant device and associating said signature with said gaming win reporting form.

* * * * *